United States Patent
Yosui et al.

(10) Patent No.: US 10,103,092 B2
(45) Date of Patent: *Oct. 16, 2018

(54) MULTILAYER SUBSTRATE, COMPONENT MOUNTED BOARD, AND METHOD FOR PRODUCING COMPONENT MOUNTED BOARD

(71) Applicant: Murata Manufacturing Co., Ltd., Nagaokakyo-shi, Kyoto-fu (JP)

(72) Inventors: Kuniaki Yosui, Nagaokakyo (JP); Keisuke Ikeno, Nagaokakyo (JP); Yuki Ito, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/673,451

(22) Filed: Aug. 10, 2017

(65) Prior Publication Data

US 2017/0338172 A1    Nov. 23, 2017

Related U.S. Application Data

(63) Continuation of application No. PCT/JP2016/081426, filed on Oct. 24, 2016.

(30) Foreign Application Priority Data

Nov. 10, 2015   (JP) ................. 2015-220255

(51) Int. Cl.
*H01L 23/498* (2006.01)
*H05K 1/02* (2006.01)
(Continued)

(52) U.S. Cl.
CPC .... *H01L 23/49822* (2013.01); *H01L 21/4853* (2013.01); *H01L 21/4857* (2013.01);
(Continued)

(58) Field of Classification Search
CPC .......... H01L 21/4853; H01L 23/49822; H01L 23/12; H01L 23/4985; H01L 23/49811; H01L 23/17; H01L 24/81; H01L 21/4857

See application file for complete search history.

(56) References Cited

U.S. PATENT DOCUMENTS 7,656,677 B2 *   2/2010   Ogawa ................ H01L 23/5383
                                                    174/260
2004/0212087 A1 * 10/2004  Murayama ........ H01L 23/49827
                                                    257/738

(Continued)

FOREIGN PATENT DOCUMENTS

JP    10-294397 A    11/1998
JP    2000-68328 A    3/2000

(Continued)

OTHER PUBLICATIONS

Official Communication issued in International Patent Application No. PCT/JP2016/081426, dated Dec. 27, 2016.

*Primary Examiner* — Khiem D Nguyen
(74) *Attorney, Agent, or Firm* — Keating & Bennett, LLP

(57) ABSTRACT

A multilayer substrate includes a flexible element assembly including a principal surface, a first to an n-th external electrode disposed on the principal surface, and at least one first dummy conductor disposed inside the element assembly and being in a floating state. When the element assembly is viewed from a normal direction that is normal to the principal surface, a distance between an m-th external electrode and a nearest external electrode therefrom among the first to the n-th external electrodes is defined as a distance Dm, an average of distances D1 to Dn is defined as an average Dave, and when the element assembly is viewed from the normal direction, an area within a circle with a center on the m-th external electrode and with a radius of Dm is defined as an area Am. The first dummy conductor is (Continued)

located in at least one area Am with a radius of Dm smaller than the average Dave when viewed from the normal direction.

19 Claims, 16 Drawing Sheets

(51) Int. Cl.
    *H05K 3/32*     (2006.01)
    *H05K 3/46*     (2006.01)
    *H01L 21/48*     (2006.01)
    *H01L 23/00*     (2006.01)
    *H01L 23/14*     (2006.01)

(52) U.S. Cl.
CPC ...... *H01L 23/145* (2013.01); *H01L 23/49811* (2013.01); *H01L 23/49827* (2013.01); *H01L 23/49838* (2013.01); *H01L 24/16* (2013.01); *H01L 24/17* (2013.01); *H01L 24/81* (2013.01); *H05K 1/02* (2013.01); *H05K 1/0298* (2013.01); *H05K 3/32* (2013.01); *H05K 3/46* (2013.01); *H01L 2224/16225* (2013.01); *H01L 2224/16227* (2013.01); *H01L 2224/17104* (2013.01); *H01L 2224/81191* (2013.01); *H01L 2224/81205* (2013.01); *H05K 3/4635* (2013.01); *H05K 2201/0141* (2013.01); *H05K 2201/0154* (2013.01); *H05K 2201/09536* (2013.01); *H05K 2201/09781* (2013.01); *H05K 2201/10674* (2013.01); *H05K 2203/0285* (2013.01)

(56) References Cited

U.S. PATENT DOCUMENTS

2008/0170819 A1*   7/2008   Kodama ................ G02B 6/138
                                                                  385/14
2014/0339695 A1*   11/2014   Yamauchi ............... H01L 24/81
                                                                   257/737

FOREIGN PATENT DOCUMENTS

| JP | 2004-327721 A | 11/2004 |
| JP | 2006-120683 A | 5/2006 |
| JP | 2014-241388 A | 12/2014 |

* cited by examiner

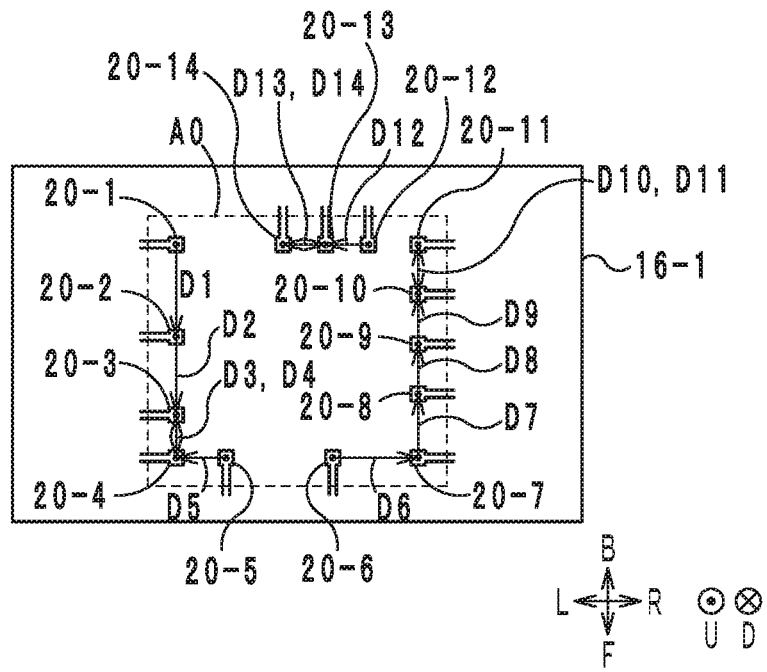
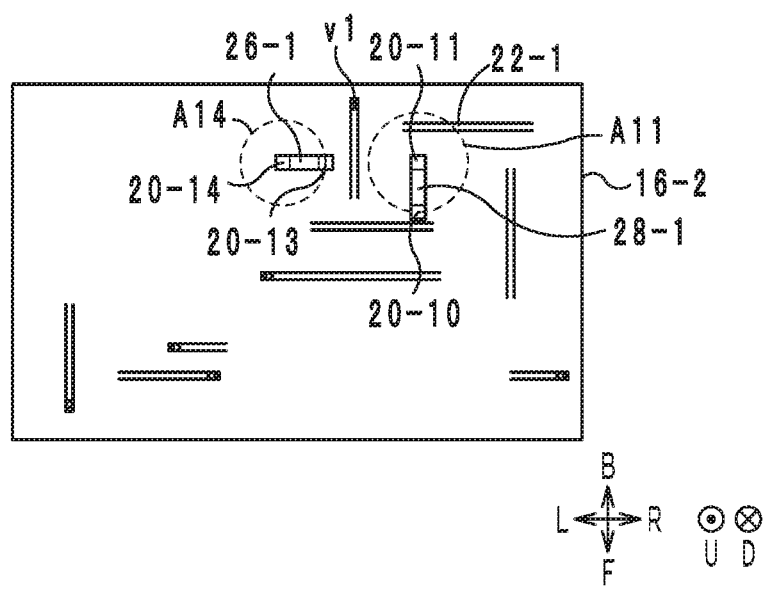

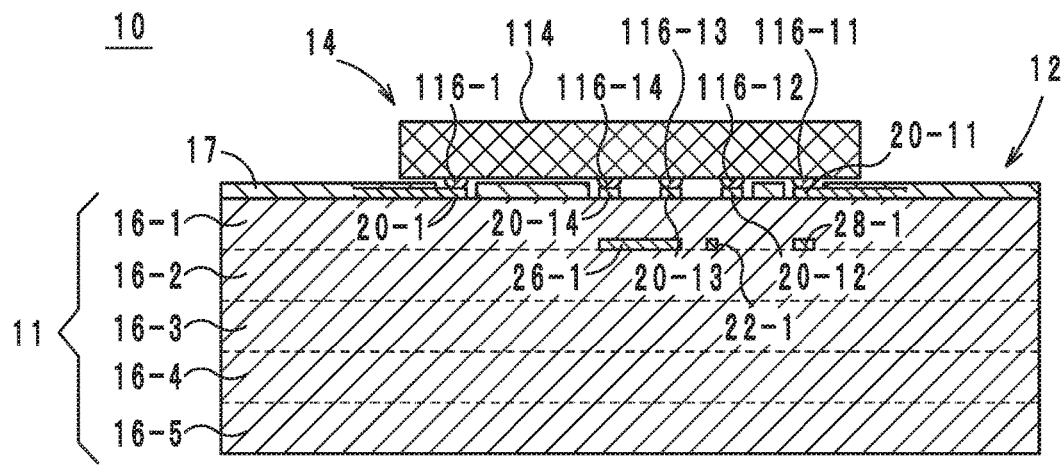
Fig.6
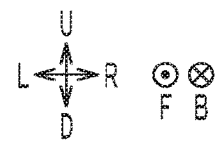
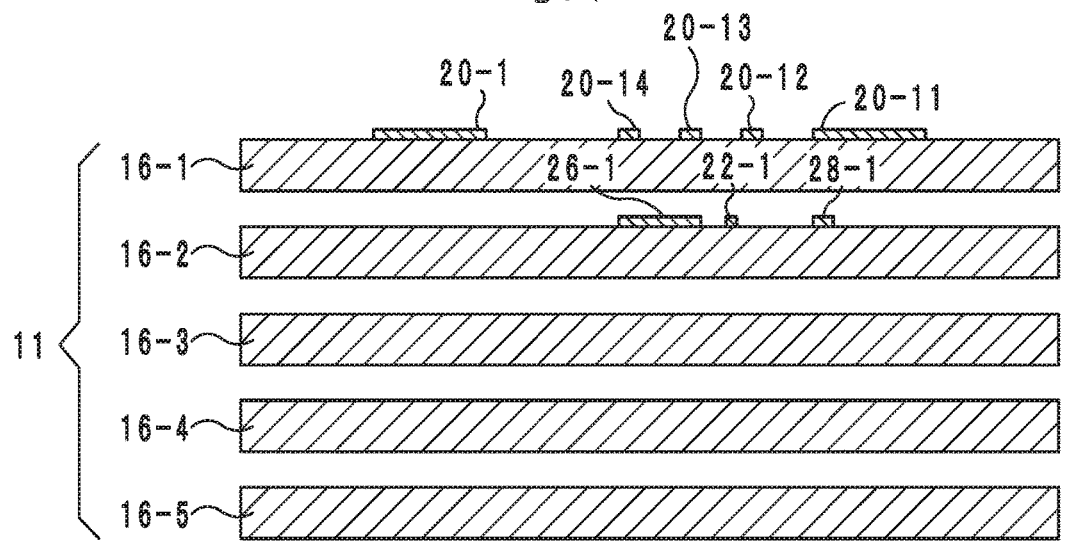
Fig.7
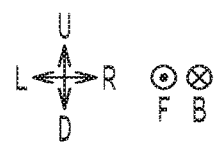

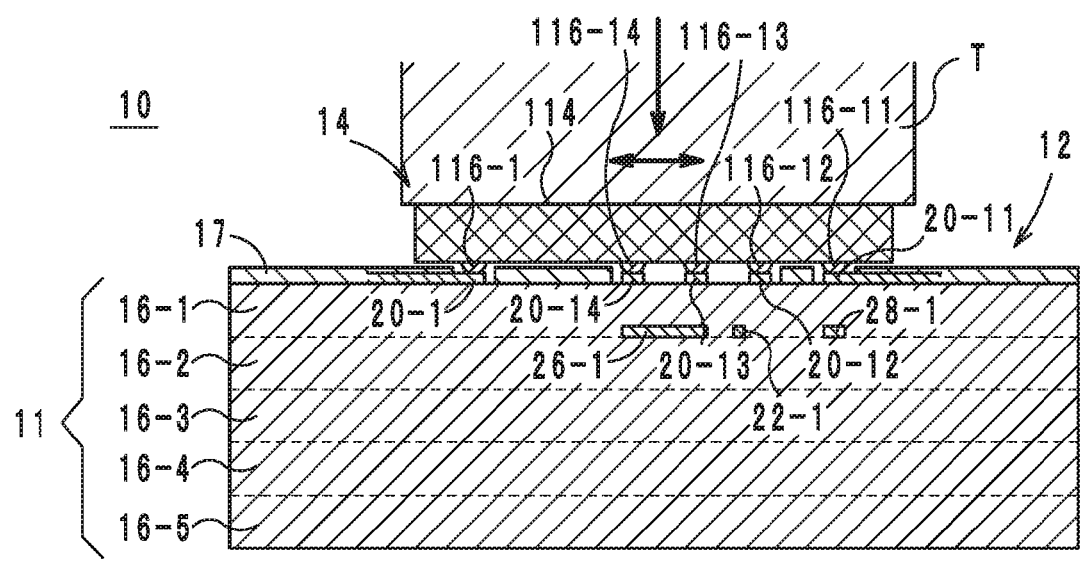
Fig.10
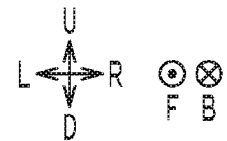

Fig.12
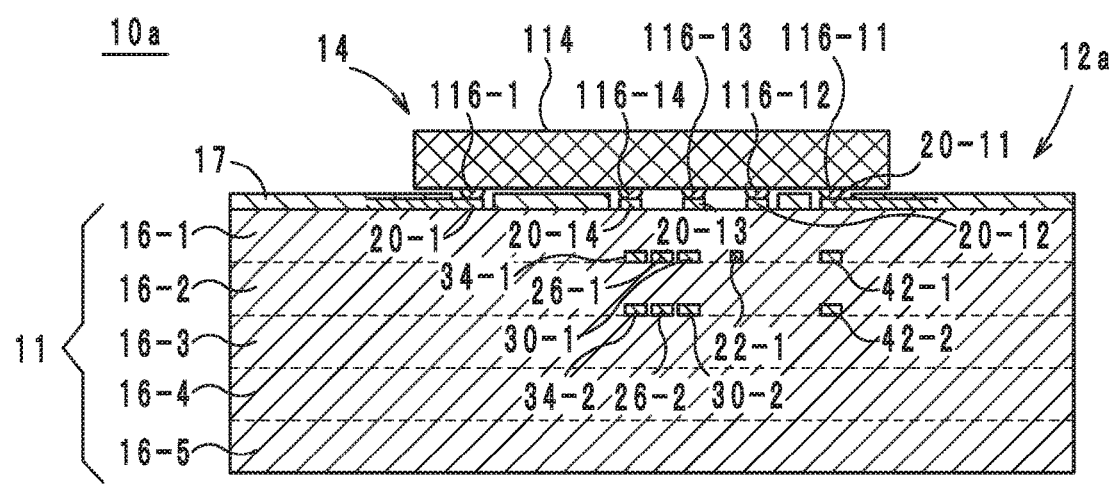
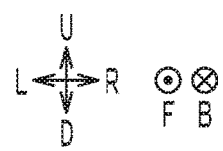

Fig.14
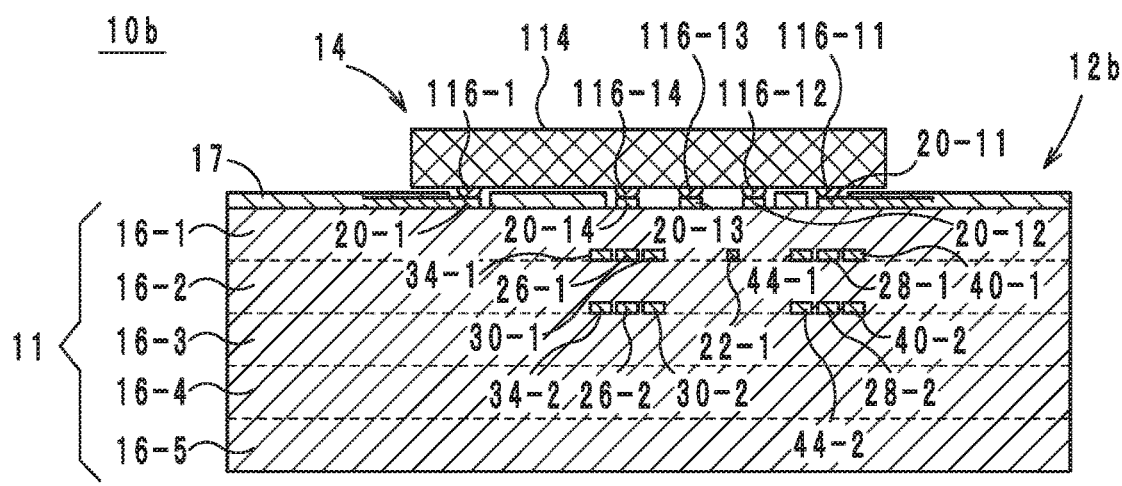
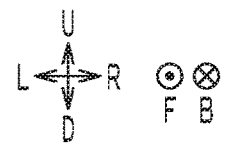

Fig. 17
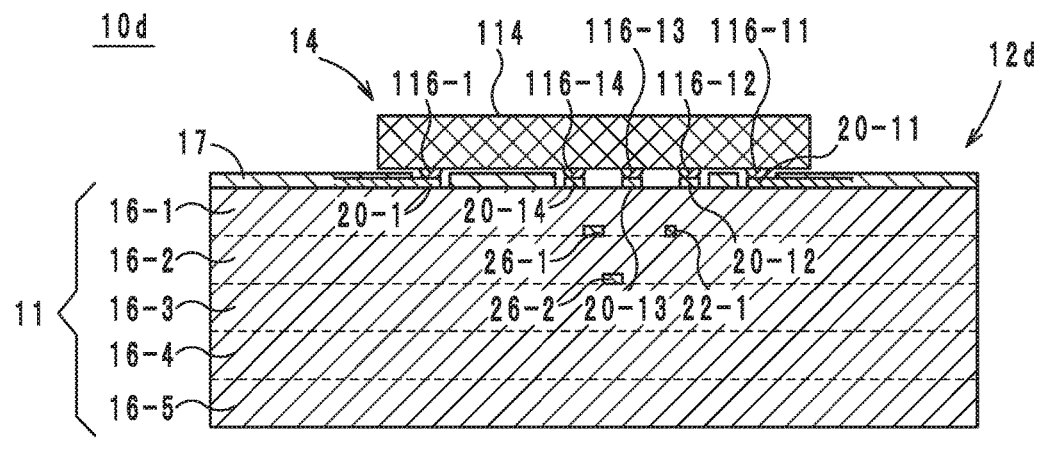
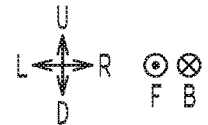
Fig. 18
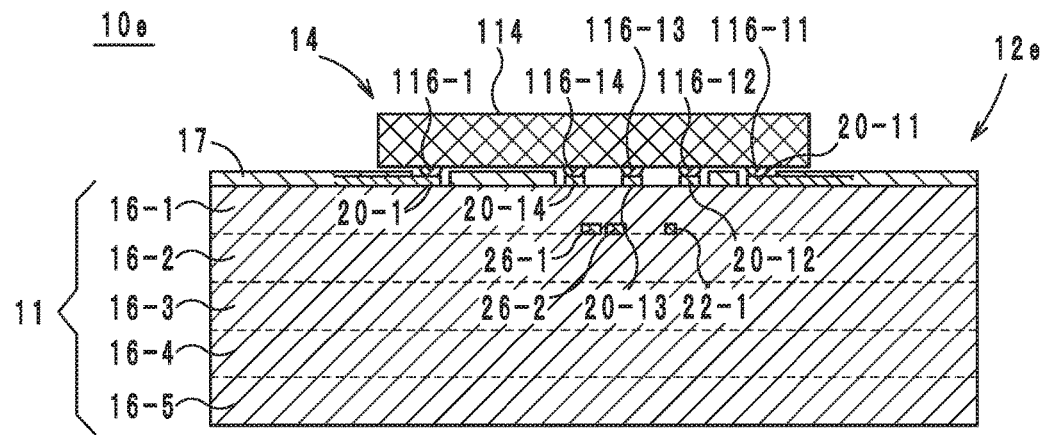
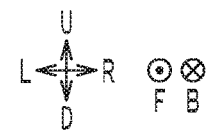

Fig.19
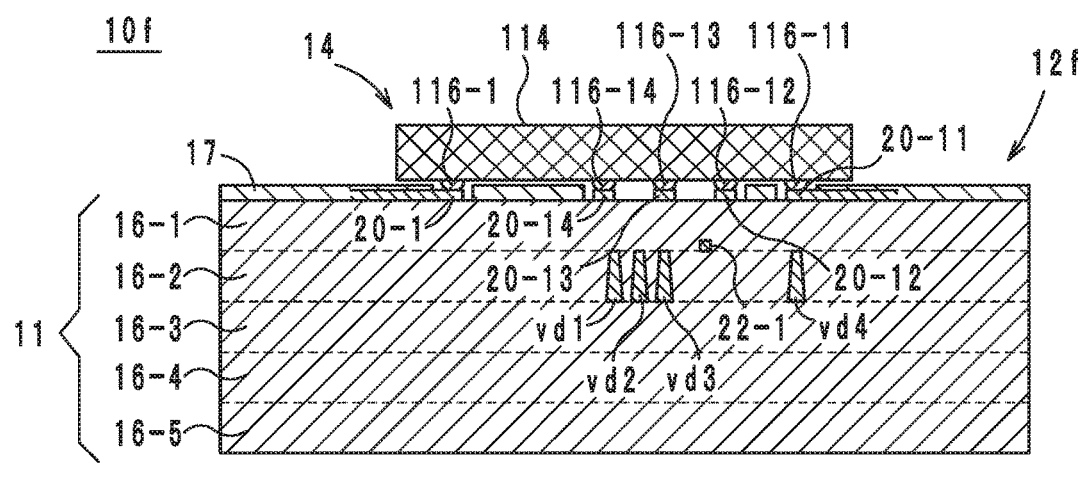
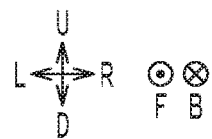

Fig.20
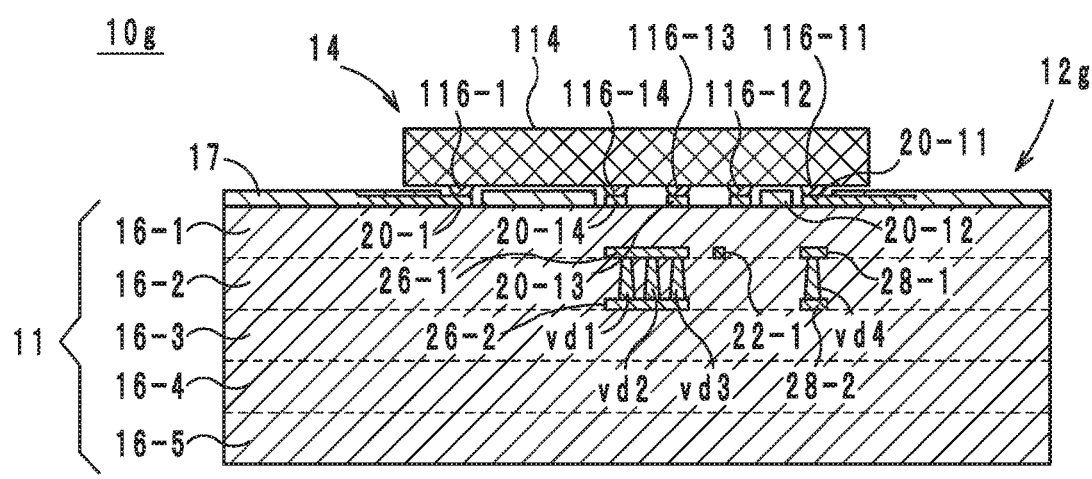
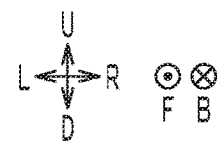

MULTILAYER SUBSTRATE, COMPONENT MOUNTED BOARD, AND METHOD FOR PRODUCING COMPONENT MOUNTED BOARD

CROSS REFERENCE TO RELATED APPLICATIONS

This application claims the benefit of priority to Japanese Patent Application No. 2015-220255 filed on Nov. 10, 2015 and is a Continuation Application of PCT Application No. PCT/JP2016/081426 filed on Oct. 24, 2016. The entire contents of each application are hereby incorporated herein by reference.

BACKGROUND OF THE INVENTION

1. Field of the Invention

The present invention relates to a multilayer substrate made of thermoplastic resin, a component mounted board, and a method for producing a component mounted board.

2. Description of the Related Art

Among past inventions relating to multilayer substrates, for example, a semiconductor mounting method disclosed in Japanese Patent Application Publication No. 2006-120683 is known. In the semiconductor mounting method, bumps of a semiconductor bare chip are bonded to wires of a flexible wiring board, which includes films of liquid crystal polymer, by ultrasonic flip-chip bonding. By applying ultrasonic vibration to the semiconductor chip in a direction that is substantially the same as the alignment direction of the liquid crystal polymer, the wires and the bumps are bonded together.

The present inventors discovered that there is a possibility that the semiconductor bare chip will tilt during the bonding of the semiconductor bare chip to the flexible wiring board in the semiconductor mounting method disclosed in Japanese Patent Application Publication No. 2006-120683. Then, the present inventors considered the cause of the tilt of the semiconductor bare chip as follows.

The semiconductor bare chip may include a dense region where bumps are distributed densely and a sparse region where bumps are distributed sparsely. In this case, the flexible wiring board includes a dense region where wires which the bumps are to be bonded to are distributed densely and a sparse region where the wires are distributed sparsely. Accordingly, during the bonding of the semiconductor bare chip to the flexible wiring board, a relatively large number of bumps and wires contact each other in the dense regions, and a relatively small number of bumps and wires contact each other in the sparse regions.

When ultrasonic vibration is applied to the semiconductor bare chip, the semiconductor bare chip is pressed against the flexible wiring board by a mounting apparatus. Then, force is applied from the semiconductor bare chip to the flexible wiring board. A relatively large number of bumps and wires contact each other in the dense regions, and a relatively small number of bumps and wires contact each other in the sparse regions. Therefore, the force applied to the dense regions is greater than the force applied to the sparse regions. Accordingly, the wires in the dense regions sink deeper than the wires in the sparse regions, thereby causing a tilt of the semiconductor bare chip. When the mounting apparatus presses the top surface of the tilted semiconductor bare chip and applies ultrasonic vibration to the semiconductor bare chip, the force is concentrated on a part of the top surface of the semiconductor bare chip. This may cause a breakage of the semiconductor bare chip.

SUMMARY OF THE INVENTION

Preferred embodiments of the present invention provide multilayer substrates which prevent a component mounted thereon from tilting thereon, and also provide component mounted boards and methods for producing component mounted boards.

A multilayer substrate according to a preferred embodiment of the present invention includes a flexible element assembly including a principal surface, a first to an n-th external electrode disposed on the principal surface and to be used to mount a component, where n is an integer not less than 3, and at least one first dummy conductor disposed inside the element assembly and being in a floating state. When the element assembly is viewed from a normal direction that is normal to the principal surface, a distance between an m-th external electrode and a nearest external electrode therefrom among the first to the n-th external electrodes is defined as a distance Dm, where m is an integer not less than 1 and not more than n, an average of distances D1 to Dn is defined as an average Dave, and when the element assembly is viewed from the normal direction, an area within a circle with a center on the m-th external electrode and with a radius of Dm is defined as an area Am. The first dummy conductor is located in at least one area Am with a radius of Dm smaller than the average Dave when viewed from the normal direction.

A component mounted board according to a preferred embodiment of the present invention includes the above-described multilayer substrate, and a component including a first to an n-th bumps and mounted on the principal surface of the multilayer substrate, where n is an integer not less than 3. The first to the n-th external electrodes are bonded to the first to the n-th bumps, respectively, by ultrasonic bonding.

A component mounted board production method according to a preferred embodiment of the present invention is a method for producing a component mounted board including a multilayer substrate including a flexible element assembly including a principal surface; a first to an n-th external electrode disposed on the principal surface and to be used to mount a component, where n is an integer not less than 3; and at least one first dummy conductor disposed inside the element assembly and being in a floating state, wherein when the element assembly is viewed from a normal direction of the principal surface, a distance between an m-th external electrode and a nearest external electrode therefrom among the first to the n-th external electrodes is defined as a distance Dm, where m is an integer not less than 1 and not more than n; an average of distances D1 to Dn is defined as an average Dave; when the element assembly is viewed from the normal direction, an area within a circle with a center on the m-th external electrode and with a radius of Dm is defined as an area Am; and the first dummy conductor is located in at least one area Am with a radius of Dm smaller than the average Dave when viewed from the normal direction; and a component including a first to an n-th bump, wherein n is an integer not less than 3. The method includes forming the multilayer substrate including the first to the n-th external electrodes and the first dummy conductor, and bonding the first to the n-th external electrodes to the first to the n-th bumps, respectively, by ultrasonic bonding.

Preferred embodiments of the present invention prevent a component mounted on a multilayer substrate from tilting thereon.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 4 is a top view of an insulating sheet 16-1.

FIG. 5 is a top view of an insulating sheet 16-2.

FIG. 6 is a sectional view along the line A-A in FIG. 1.

FIG. 7 is a sectional view of the component mounted board 10 during a production process.

FIG. 10 is a sectional view of the component mounted board 10 during the production process.

FIG. 12 is a sectional view of a component mounted board 10a according to the first modification of a preferred embodiment of the present invention.

FIG. 14 is a sectional view of a component mounted board 10b according to the second modification of a preferred embodiment of the present invention.

FIG. 17 is a sectional view of a component mounted board 10d according to a fourth modification of a preferred embodiment of the present invention.

FIG. 18 is a sectional view of a component mounted board 10e according to a fifth modification of a preferred embodiment of the present invention.

FIG. 19 is a sectional view of a component mounted board 10f according to a sixth modification of a preferred embodiment of the present invention.

FIG. 20 is a sectional view of a component mounted board 10g according to a seventh modification of a preferred embodiment of the present invention.

DETAILED DESCRIPTION OF THE PREFERRED EMBODIMENTS

Figure 1:
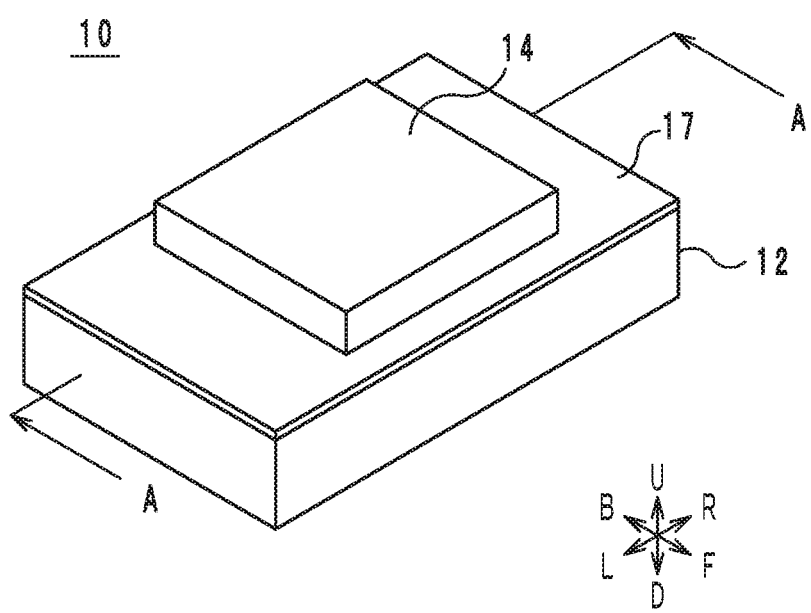
FIG. 1 is a perspective view of a component mounted board 10 according to a preferred embodiment of the present invention.
Figure 2:
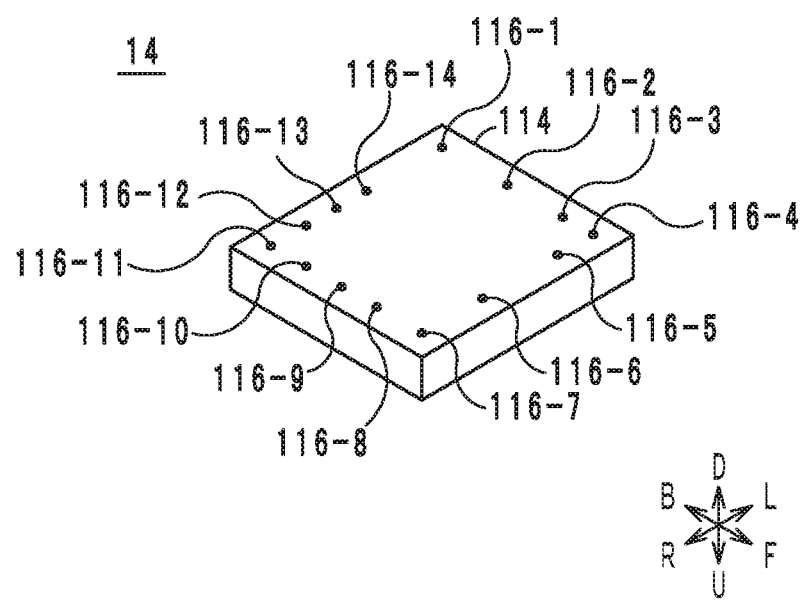
FIG. 2 is a perspective view of a mounted component 14.
Figure 3:
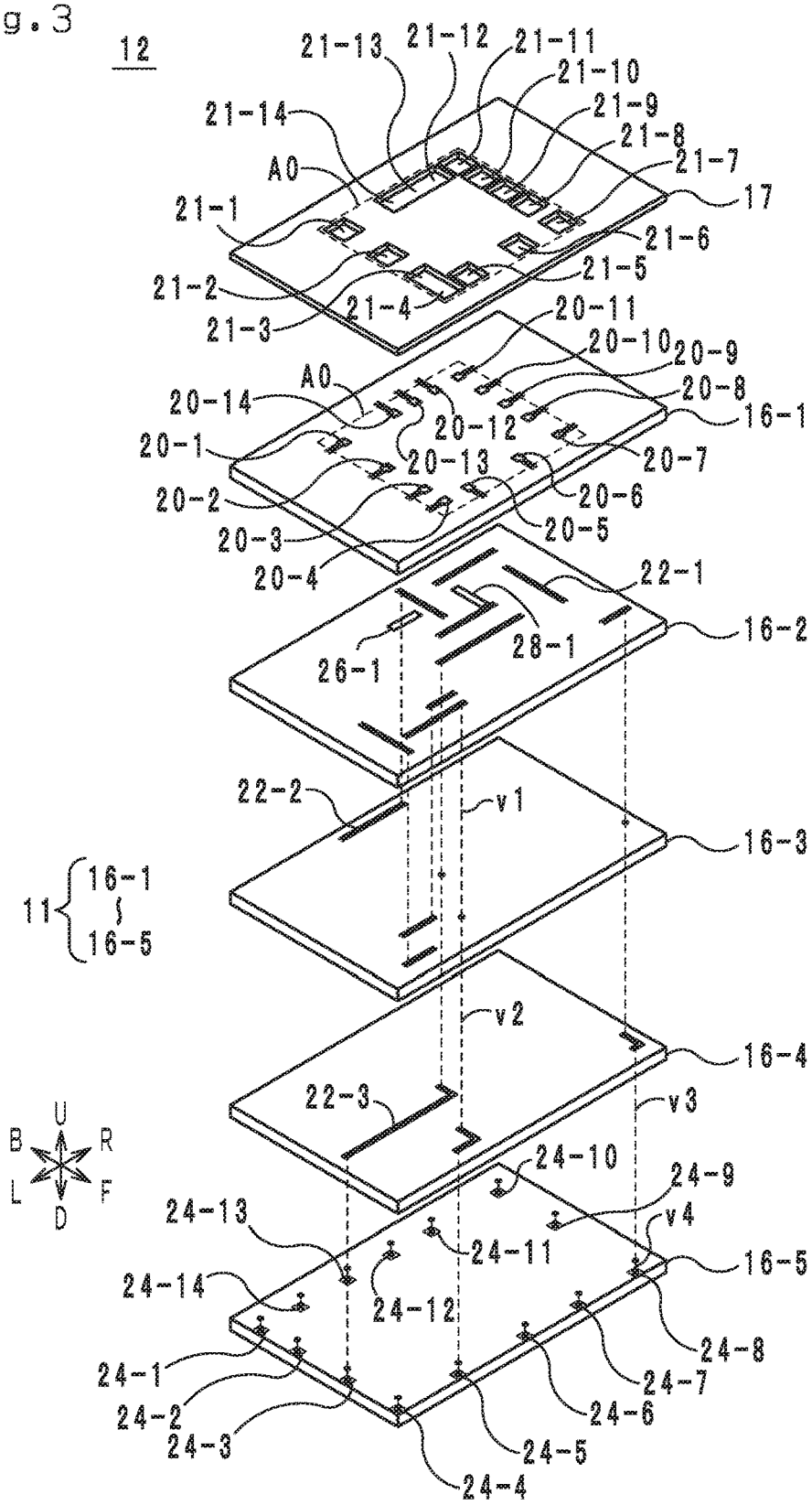
FIG. 3 is an exploded perspective view of a multilayer substrate 12.

The structure of multilayer substrates and component mounted substrates according to preferred embodiments of the present invention will hereinafter be described with reference to the drawings. FIG. 1 is a perspective view of the component mounted board 10 according to a preferred embodiment of the present invention. FIG. 2 is a perspective view of a component 14 mounted thereon. FIG. 3 is an exploded perspective view of the multilayer substrate 12. FIG. 4 is a top view of an insulating sheet 16-1. FIG. 5 is a top view of an insulating sheet 16-2. FIG. 6 is a sectional view along the line A-A in FIG. 1. In the following, the layer stacking direction of the multilayer substrate 12 is defined as an up-down direction (an example of a normal direction that is normal to a principal surface of an element assembly). The lengthwise direction of the multilayer substrate 12 when the multilayer substrate 12 is viewed from above is defined as a right-left direction, and the widthwise direction of the multilayer substrate 12 when the multilayer substrate 12 is viewed from above is defined as a front-back direction. The up-down direction, the right-left direction and the front-back direction are perpendicular to one another.

The component mounted board 10 is, for example, a module that incorporates a semiconductor integrated circuit and is to be mounted in a cell phone or any other electronic device. As shown in FIG. 1, the component mounted board 10 includes a multilayer substrate 12 and a component 14 mounted thereon.

The component 14 is, for example, a semiconductor integrated circuit such as RFIC, CCD or any other image pick-up element. As shown in FIG. 2, the component 14 includes a body 114 and bumps 116-1 to 116-14. The body 114 is plate-shaped and is rectangular or substantially rectangular when viewed from above. The upper principal surface of the body 114 will be hereinafter referred to as a top surface, and the lower principal surface of the body 114 will be hereinafter referred to as a bottom surface.

The bumps 116-1 to 116-14 (examples of a first to an n-th bump) are disposed on the bottom surface of the body 114, and define and function as external terminals for connection to the multilayer substrate 12. The bumps 116-1 to 116-14 are preferably made of gold or other metal, for example. Before the component 14 is mounted to the substrate 12, each of the bumps 116-1 to 116-14 is spherical or hemispherical. The bumps 116-1 to 116-14 are arranged along the outer edge of the bottom surface of the body 114. Specifically, the bumps 116-1 to 116-4 are aligned in this order from back to front along the left side of the bottom surface of the body 114. The bumps 116-4 to 116-7 are aligned in this order from left to right along the front side of the bottom surface of the body 114. The bumps 116-7 to 116-11 are aligned in this order from front to back along the right side of the bottom surface of the body 114. The bumps 116-11 to 116-14 are aligned in this order from right to left along the back side of the bottom surface of the body 114. The bumps 116-1 to 116-14 are arranged at irregular intervals in the right-left direction and in the front-back direction. Accordingly, there are dense-bump regions where the bumps 116-1 to 116-14 are densely distributed and sparse-bump regions where the bumps 116-1 to 116-14 are sparsely distributed.

The multilayer substrate 12 is a flexible substrate which the component 14 is to be mounted to. As shown in FIG. 3, the multilayer substrate 12 includes an element assembly 11, a protective layer 17, external electrodes 20-1 to 20-14 and 24-1 to 24-14, thin wiring conductors 22-1 to 22-3, thin dummy conductors 26-1, 26-2, 28-1 and 28-2, and via-hole conductors v1 to v4. The multilayer substrate 12 includes other thin wiring conductors in addition to the thin wiring conductors 22-1 to 22-3, but in FIG. 3, the thin wiring conductors other than the thin wiring conductors 22-1 to 22-3 are not shown. The multilayer substrate 12 includes other via-hole conductors in addition to the via-hole conductors v1 to v4, but in FIG. 3, the via-hole conductors other than the via-hole conductors v1 to v4 are not shown. In FIG. 3, only representative thin wiring conductors and representative via-hole conductors are marked with reference symbols.

As shown in FIG. 3, the element assembly 11 is a flexible plate that is rectangular or substantially rectangular when viewed from above, for example. The long sides of the element assembly 11 are parallel to the right-left direction. A shown in FIG. 3, the element assembly 11 is a multilayered body including insulating sheets 16-1 to 16-5 (an example of a plurality of insulating layers) stacked in this order from top to bottom. The upper principal surface of the element assembly 11 will hereinafter be referred to as a top surface, and the lower principal surface of the element assembly 11 will hereinafter be referred to as a bottom surface.

As shown in FIG. 3, each of the insulating sheets 16-1 to 16-5 preferably is rectangular or substantially rectangular and has the same shape as the element assembly 11 when viewed from above, for example. The long sides of the insulating sheets 16-1 to 16-5 are parallel to the right-left direction. The insulating sheets 16-1 to 16-5 are insulating layers made of flexible thermoplastic resin such as polyimide, liquid crystal polymer or the like. The upper principal surface of each of the insulating sheets 16-1 to 16-5 will hereinafter be referred to as an upper surface, and the lower principal surface of each of the insulating sheets 16-1 to 16-5 will hereinafter be referred to as a lower surface.

The external electrodes 20-1 to 20-14 (examples of a first to an n-th external electrode) preferably are thin rectangular or substantially rectangular conductors, and are located on the upper surface of the insulating sheet 16-1 to correspond to the bumps 116-1 to 116-14, respectively, for example. The arrangement of the external electrodes 20-1 to 20-14 is described in detail below.

When the multilayer substrate 12 is viewed from above, the area to overlap the component 14 is referred to as an area A0. The external electrodes 20-1 to 20-14 are located within the area A0 and are arranged along the outer edge of the area A0. Specifically, the external electrodes 20-1 to 20-4 are aligned in this order from back to front along the left side of the area A0. The external electrodes 20-4 to 20-7 are aligned in this order from left to right along the front side of the area A0. The external electrodes 20-7 to 20-11 are aligned in this order from front to back along the right side of the area A0. The external electrodes 20-11 to 20-14 are aligned in this order from right to left along the back side of the area A0.

The external electrodes 20-1 to 20-14 are arranged at irregular intervals in the right-left direction and in the front-back direction. Accordingly, there are dense-external-electrode regions where the external electrodes 20-1 to 20-14 are densely distributed and sparse-external-electrode regions where the external electrodes 20-1 to 20-14 are sparsely distributed. Therefore, when the multilayer substrate 12 is viewed from above, the distance from each of the external electrodes 20-1 to 20-14 to the nearest external electrode varies. Distances D1 to D14 are defined as follows (see FIG. 4).

Distance D1: When viewed from above, the distance between the external electrode 20-1 and the external electrode that is the nearest from the external electrode 20-1 among the external electrodes 20-1 to 20-14 (that is, the external electrode 20-2) is defined as a distance D1.

Distance D2: When viewed from above, the distance between the external electrode 20-2 and the external electrode that is the nearest from the external electrode 20-2 among the external electrodes 20-1 to 20-14 (that is, the external electrode 20-3) is defined as a distance D2.

Distance D3: When viewed from above, the distance between the external electrode 20-3 and the external electrode that is the nearest from the external electrode 20-3 among the external electrodes 20-1 to 20-14 (that is, the external electrode 20-4) is defined as a distance D3.

Distance D4: When viewed from above, the distance between the external electrode 20-4 and the external electrode that is the nearest from the external electrode 20-4 among the external electrodes 20-1 to 20-14 (that is, the external electrode 20-3) is defined as a distance D4.

Distance D5: When viewed from above, the distance between the external electrode 20-5 and the external electrode that is the nearest from the external electrode 20-5 among the external electrodes 20-1 to 20-14 (that is, the external electrode 20-4) is defined as a distance D5.

Distance D6: When viewed from above, the distance between the external electrode 20-6 and the external electrode that is the nearest from the external electrode 20-6 among the external electrodes 20-1 to 20-14 (that is, the external electrode 20-7) is defined as a distance D6.

Distance D7: When viewed from above, the distance between the external electrode 20-7 and the external electrode that is the nearest from the external electrode 20-7 among the external electrodes 20-1 to 20-14 (that is, the external electrode 20-8) is defined as a distance D7.

Distance D8: When viewed from above, the distance between the external electrode 20-8 and the external electrode that is the nearest from the external electrode 20-8 among the external electrodes 20-1 to 20-14 (that is, the external electrode 20-9) is defined as a distance D8.

Distance D9: When viewed from above, the distance between the external electrode 20-9 and the external electrode that is the nearest from the external electrode 20-9 among the external electrodes 20-1 to 20-14 (that is, the external electrode 20-10) is defined as a distance D9.

Distance D10: When viewed from above, the distance between the external electrode 20-10 and the external electrode that is the nearest from the external electrode 20-10 among the external electrodes 20-1 to 20-14 (that is, the external electrode 20-11) is defined as a distance D10.

Distance D11: When viewed from above, the distance between the external electrode 20-11 and the external electrode that is the nearest from the external electrode 20-11 among the external electrodes 20-1 to 20-14 (that is, the external electrode 20-10) is defined as a distance D11.

Distance D12: When viewed from above, the distance between the external electrode 20-12 and the external electrode that is the nearest from the external electrode 20-12 among the external electrodes 20-1 to 20-14 (that is, the external electrode 20-13) is defined as a distance D12.

Distance D13: When viewed from above, the distance between the external electrode 20-13 and the external electrode that is the nearest from the external electrode 20-13 among the external electrodes 20-1 to 20-14 (that is, the external electrode 20-14) is defined as a distance D13.

Distance D14: When viewed from above, the distance between the external electrode 20-14 and the external electrode that is the nearest from the external electrode 20-14 among the external electrodes 20-1 to 20-14 (that is, the external electrode 20-13) is defined as a distance D14.

The average of the distances D1 to D14 is defined as an average Dave. In this case, the following formula (1) holds between the distances D1 to D14 and the average Dave.

$$D1 > D2 = D6 > D7 > Dave > D5 = D8 = D9 = D10 = D11 > D3 = D4 = D12 = D13 = D14 \quad (1)$$

The external electrodes 20-1 to 20-14 arranged in this manner are used to mount the component 14. Specifically, the external electrodes 20-1 to 20-14 are bonded to the bumps 116-1 to 116-14, respectively, by ultrasonic welding (also referred to as ultrasonic bonding). During the ultrasonic welding, the bottom edges of the bumps 116-1 to 116-14 are crushed slightly as shown in FIG. 6. Accordingly, the bumps 116-1 to 116-14 are not in point contact but in surface contact with the external electrodes 20-1 to 20-14, respectively.

The protective layer 17 is a resin layer covering almost the entire upper surface of the insulating sheet 16-1. However, the protective layer 17 has rectangular or substantially rectangular openings 21-1 to 21-14, and there are regions not covered by the protective layer 17. The external electrodes 20-1 to 20-14 are exposed to the outside of the multilayer substrate 12 through the openings 21-1 to 21-14, respectively.

The external electrodes 24-1 to 24-14 preferably are rectangular or substantially rectangular when viewed from above, for example. The external electrodes 24-1 to 24-14 are used to mount the multilayer substrate 12 to a printed wiring board or any other circuit board (not shown), and at least one of the external electrodes 24-1 to 24-14 is to be electrically connected to the circuit board. The external electrodes 24-1 to 24-14 are arranged along the outer edge of the lower surface of the insulating sheet 16-5. Specifically, the external electrodes 24-1 to 24-4 are aligned in this order from back to front along the left side of the lower surface of the insulating sheet 16-5. The external electrodes 24-4 to 24-8 are aligned in this order from left to right along the front side of the lower surface of the insulating sheet 16-5. The external electrodes 24-8 to 24-10 are aligned in this order from front to back along the right side of the lower surface of the insulating sheet 16-5. The external electrodes 24-10 to 24-14 are aligned in this order from right to left along the back side of the lower surface of the insulating sheet 16-5.

The thin wiring conductors 22-1 to 22-3 (examples of a second thin conductor) are linear thin conductors disposed on the insulating sheets 16-2 to 16-4, respectively. Thus, the thin wiring conductors 22-1 to 22-3 are located inside the element assembly 11. The via-hole conductors v1 to v4 pierce through the insulating sheets 16-2 to 16-5 in the up-down direction, respectively. The via-hole conductor v1 connects the thin wiring conductor 22-1 and the thin wiring conductor 22-2. The via-hole conductor v2 connects the thin wiring conductor 22-2 and the thin wiring conductor 22-3. The via-hole conductors v3 and v4 connect the tin wiring conductor 22-3 and the external electrodes 24-1 to 24-14. Other via-hole conductors and other thin wiring conductors are disposed in/on the insulating sheet 16-1, but the via-hole conductors and the thin wiring conductors are not shown in FIG. 3. The external electrodes 20-1 to 20-14 are electrically connected to the external electrodes 24-1 to 24-14 through the thin wiring conductors 22-1 to 22-3, the via-hole conductors v1 to v4, and the thin wiring conductors and the via-hole conductors that are not shown in the drawings.

In order to prevent a component mounted on the multilayer substrate from tilting, the multilayer substrate 12 includes the thin dummy conductors 26-1 and 28-1 (examples of a first dummy conductor, examples of first thin conductors). The thin dummy conductors 26-1 and 28-1 are described in detail below.

As shown in FIG. 5, when viewed from above, the areas within circles having centers on the median points of the respective external electrodes 20-1 to 20-14 (examples of an m-th external electrode) and having radii of the respective distances D1 to D14 (examples of a distance Dm) are defined as areas A1 to A14 (examples of an area Am), respectively. (In FIG. 5, only the areas A11 and A14 are shown.)

The thin dummy conductors 26-1 and 28-1 are thin rectangular or substantially rectangular conductors disposed on the upper surface of the insulating sheet 16-2 (that is, disposed inside the element assembly 11). The dummy conductors 26-1 and 28-1 are not connected to any other conductors, and therefore are in a floating state. The floating state is a state not to be connected to the electric potential of the electric source or any other electric potential. When viewed above, the thin dummy conductors 26-1 and 28-1 are located within the areas A14 and A11, respectively. In the present preferred embodiment, the thin dummy conductor 26-1 is a strip-shaped conductor extending in the right-left direction, and overlaps the external electrodes 20-13 and 20-14 when viewed from above. The thin dummy conductor 28-1 is a strip-shaped conductor extending in the front-back direction, and overlaps the external electrodes 20-10 and 20-11 when viewed from above. The areas A14 and A11 are among the areas A3 to A5 and A8 to A14 that have radii of D3 to D5 and D8 to D14, respectively, which are smaller than the average Dave.

Any external electrode is present near the external electrodes 20-3 to 20-5 and 20-8 to 20-14, which correspond to the areas A3 to A5 and A8 to A14, respectively, and the areas A3 to A5 and A8 to A14 are dense-external-electrode regions where the external electrodes are densely distributed. In at least one of the areas A3 to A5 and A8 to A14 where the external electrodes are densely distributed (in this case, in the areas A14 and A11), the dummy conductors 26-1 and 28-1 are located. The area A14 where the dummy conductor 26-1 is located is an area with the smallest radius of D14. The area A11 where the dummy conductor 28-1 is located is an area with the fifth smallest radius of D11.

A production method of the component mounted board 10 will hereinafter be described with reference to the drawings. FIGS. 7 to 10 are sectional views of the component mounted board 10 during a production process thereof. In the following, a case of producing one multilayer substrate 12 will be described as an example. Practically, however, large-sized insulating sheets are stacked, and the stack of insulating sheets is cut, such that a number of multilayer substrates 12 are produced at a time.

First, insulating sheets 16-1 to 16-5 made of liquid polymer are prepared. Next, a sheet of copper foil is applied entirely on one surface of each of the insulating sheets 16-1 to 16-5. Specifically, sheets of copper foil are applied onto the upper surfaces of the insulating sheets 16-1 to 16-4, respectively. A sheet of copper foil is applied onto the lower surface of the insulating sheet 16-5. The sheets of copper foil on the insulating sheets 16-1 to 16-5 are galvanized for corrosion proofing and are smoothened. Any metal foil other than copper foil may be used.

Next, the copper foil on the upper surface of the insulating sheet 16-1 is patterned, such that the external electrodes 20-1 to 20-14 and the thin wiring conductor (not shown) are formed on the upper surface of the insulating sheet 16-1. Specifically, resists having the same shapes as the external electrodes 20-1 to 20-14 shown in FIG. 3 and a resist having the same shape as the thin wiring conductor (not shown) are printed on the copper foil on the upper surface of the insulating sheet 16-1. Next, the copper foil is etched, such that the copper foil is removed from the portions that are not covered by the resists. Thereafter, the upper surface of the insulating sheet 16-1 is sprayed with a wash solution (resist remover), such that the resists are removed. Thus, as shown in FIG. 3, the external electrodes 20-1 to 20-14 and the thin wiring conductor (not shown) are formed on the upper surface of the insulating sheet 16-1 by photolithography.

Next, the thin wiring conductors 22-1 to 22-3 and the thin dummy conductors 26-1 and 28-1 are formed on the upper surfaces of the insulating sheets 16-2 to 16-4 as shown in FIG. 3. Also, the external electrodes 24-1 to 24-14 are formed on the lower surface of the insulating sheet 16-5 as shown in FIG. 3. The processes of forming the thin wiring conductors 22-1 to 22-3, the external electrodes 24-1 to 24-14 and the thin dummy conductors 26-1 and 26-2 are the same as the process of forming the external electrodes 20-1 to 20-14 and the thin wiring conductor (not shown), and descriptions of the processes are omitted.

Next, the points of the insulating sheets 16-1 to 16-5 where the via-hole conductors v1 to v4 and the other via-hole conductors that are not shown in the drawings are to be formed are irradiated with a laser beam, such that through holes are made. The through holes are filled with conductive paste mainly consisting of copper, silver or any other metal.

Figure 8:
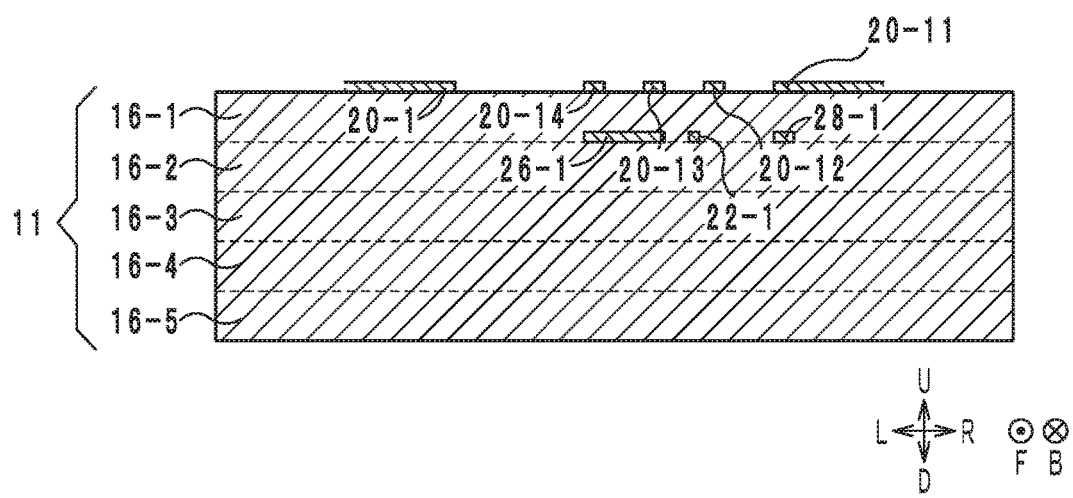
FIG. 8 is a sectional view of the component mounted board 10 during the production process.

Next, thermal-compression bonding is performed to form the multilayer substrate 12. Specifically, as shown in FIG. 7, the insulating sheets 16-1 to 16-5 are stacked upon one another, and a pressing treatment and a heating treatment (that is, thermal-compression bonding) are applied to the insulating sheets 16-1 to 16-5. The pressing treatment is performed by pressing the insulating sheets 16-1 to 16-5 from above and below. The application of a pressing treatment and a heating treatment to the insulating sheets 16-1 to 16-5 leads to softening of the insulating sheets 16-1 to 16-5 and hardening of the conductive paste in the through holes. Thus, the insulating sheets 16-1 to 16-5 are bonded together, and the via-hole conductors v1 to v4 are formed. Through the process above, the element assembly 11 is formed as shown in FIG. 8.

Figure 9:
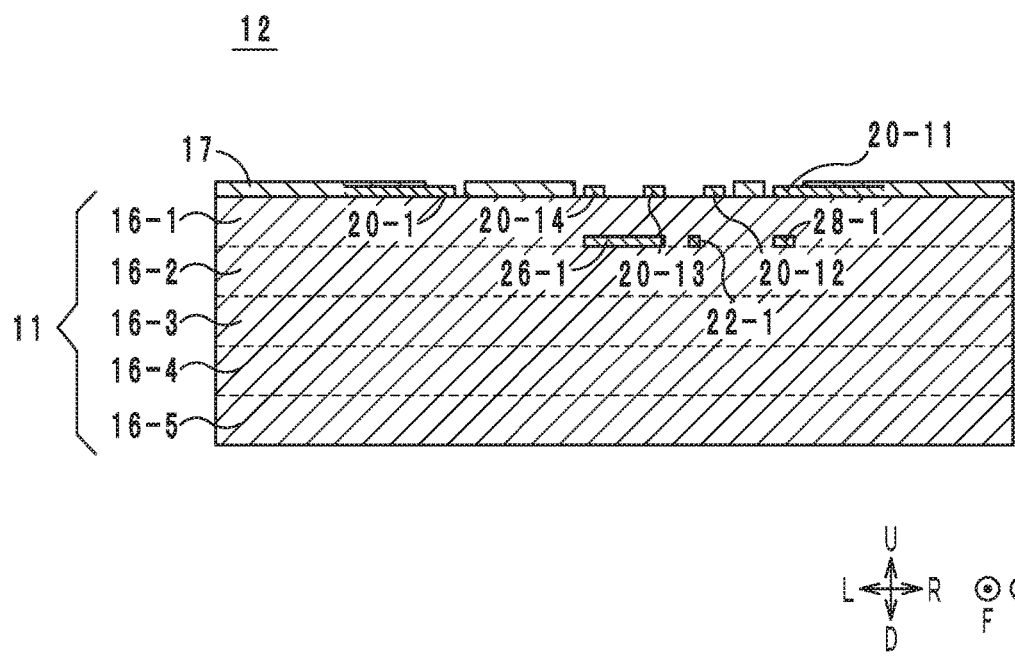
FIG. 9 is a sectional view of the component mounted board 10 during the production process.

Next, resin (resist) paste is applied onto the upper surface of the insulating sheet 16-1 by screen printing, such that the protective layer 17 is formed on the upper surface of the insulating sheet 16-1 as shown in FIG. 9. Through the process above, the multilayer substrate 12 is produced.

Next, the component 14 is mounted to the multilayer substrate 12 as shown in FIG. 10. Specifically, the component 14 is placed on the multilayer substrate 12 such that the bumps 116-1 to 116-14 come into contact with the external electrodes 20-1 to 20-14, respectively. Thereafter, an ultrasonic bonding machine T is pressed against the top surface of the component 14, and the ultrasonic bonding machine T is driven. Thus, ultrasonic vibration is transmitted to the bumps 116-1 to 116-14 and the external electrodes 20-1 to 20-14 via the body 114. Then, the external electrodes 20-1 to 20-14 are metallurgically joined to the bumps 116-1 to 116-14, respectively, by the ultrasonic vibration. Through the process above, the component mounted board 10 is produced.

In the component mounted board 10 and the multilayer substrate 12 having the above-described structure, the mounted component 14 is prevented from tilting on the multilayer substrate 12. A multilayer substrate including no such dummy conductor as the thin dummy conductors 26-1 and 28-1 will be described below as a comparative example for comparison with the multilayer substrate 12. The portions of the multilayer substrate as a comparative example are denoted by the same reference symbols used for the corresponding parts of the multilayer substrate 12.

In the multilayer substrate as a comparative example, the areas A3 to A5 and A8 to A14 are areas having radii of D3 to D5 and D8 to D14, respectively, which are smaller than the average Dave. Any external electrode is present near the external electrodes 20-3 to 20-5 and 20-8 to 20-14, which correspond to the areas A3 to A5 and A8 to A14, respectively, and the areas A3 to A5 and A8 to A14 are dense-external-electrode regions where the external electrodes are densely distributed. On the other hand, the areas A1, A2, A6 and A7 are sparse-external-electrode regions where the external electrodes are sparsely distributed. Therefore, in the multilayer substrate as a comparative example, in the process of ultrasonic bonding, the force applied to the areas A3 to A5 and A8 to A14 is greater than the force applied to the areas A1, A2, A6 and A7. Accordingly, the areas A3 to A5 and A8 to A14 sink deeper than the areas A1, A2, A6 and A7, thus causing a tilt of the mounted component 14.

Then, the multilayer substrate 12 includes the thin dummy conductors 26-1 and 28-1 that are located within the areas A14 and A11, respectively, which are among the areas A3 to A5 and A8 to A14, when viewed from above. The thin dummy conductors 26-1 and 28-1 are less deformable than the insulating sheets 16-1 and 16-5. Therefore, the thin dummy conductors 26-1 and 28-1 prevent sinking of the areas A14 and A11. Consequently, the component mounted board 10 and the multilayer substrate 12 prevent the mounted component 14 from tilting on the multilayer substrate 12. The prevention of a tilt of the mounted component 14 leads to a prevention of breakage of the mounted component 14 and other problems.

The component mounted board 10 and the multilayer substrate 12 prevent the mounted component 14 from tilting on the multilayer substrate 12 more effectively for the following reason. The area A14 is an area having the smallest radius of D14. Therefore, in the process of mounting the component 14 to the multilayer substrate 12, the amount of sinking of the area A14 would be the greatest of the amounts of sinking of the areas A1 to A14. Note, however, that the amounts of sinking of the areas A3, A4, A12, A13 and A14 would be equal or substantially equal to one another. In the multilayer substrate 12, therefore, the thin dummy conductor 26-1 is disposed within the area A14, when the multilayer substrate 12 is viewed from above. This decreases the number of deep sinking areas, thus effectively preventing a tilt of the mounted component 14 on the multilayer substrate 12. The most desired is providing thin dummy conductors within all of the areas A3, A4, A12, A13 and A14 which would sink deep.

In the component mounted board 10 and the multilayer substrate 12, the thin dummy conductors 26-1 and 28-1 are disposed on the insulating sheet 16-2, which is different from the insulating sheet 16-1 where the external electrodes 20-1 to 20-14 are disposed. This prevents short circuits between the thin dummy conductors 26-1 and 28-1 and the external electrodes 20-1 to 20-14.

Figure 11:
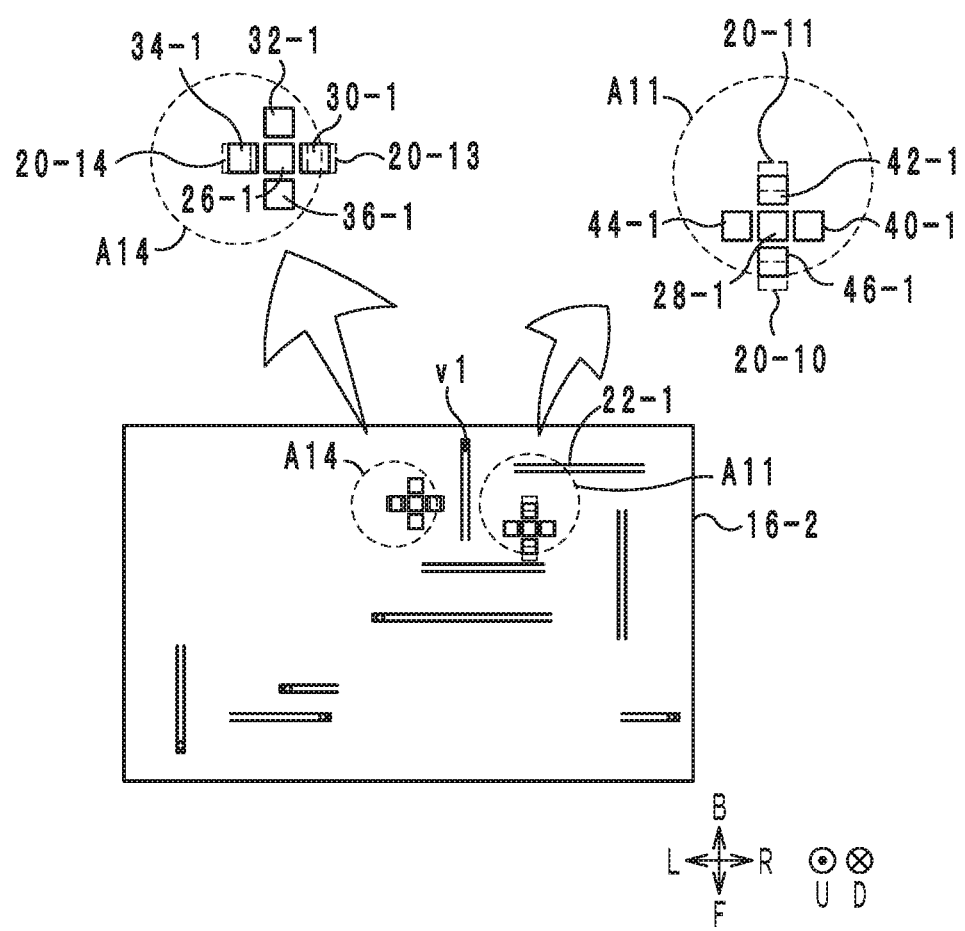
FIG. 11 is a top view of an insulating sheet 16-2 of a multilayer substrate 12a according to a first modification of a preferred embodiment of the present invention.

Next, a multilayer substrate and a component mounted board according to a first modification of a preferred embodiment of the present invention will be described with reference to the drawings. FIG. 11 is a top view of the insulating sheet 16-2 of the multilayer substrate 12a according to the first modification. FIG. 12 is a sectional view of the component mounted board 10a according to the first modification.

The multilayer substrate 12a differs from the multilayer substrate 12 in the following two points. The first is the shapes and positions of the thin dummy conductors 26-1 and 28-1. The second is that the multilayer substrate 12a further includes thin dummy conductors 26-2, 28-2, 30-1, 32-1, 34-1, 36-1, 30-2, 32-2, 34-2, 36-2, 40-1, 42-1, 44-1, 46-1, 40-2, 42-2, 44-2 and 46-2 (examples of a second dummy conductor) though the dummy conductors 30-2, 34-2, 40-2, 42-2, 44-2 and 46-2 are not shown in FIGS. 11 and 12. In the following, the multilayer substrate 12a and the component mounted board 10a will be described with a focus on the difference from the multilayer substrate 12 and the component mounted board 10.

First, the first difference is described. The thin dummy conductors 26-1 and 28-1 preferably are rectangular or substantially rectangular when viewed from above. The thin dummy conductor 26-1 is located between the external electrodes 20-13 and 20-14 when viewed from above, and does not overlap the external electrodes 20-13 and 20-14. The thin dummy conductor 28-1 is located between the external electrodes 20-10 and 20-11 when viewed from above, and does not overlap the external electrodes 20-10 and 20-11.

Next, the second difference is described. The thin dummy conductors 26-2 and 28-2 preferably are thin rectangular or substantially rectangular conductors disposed on the upper surface of the insulating sheet 16-3 (that is, disposed inside the element assembly 11), which is different from the insulating sheet 16-2 where the thin dummy conductors 26-1 and 28-1 are disposed. The thin dummy conductors 26-2 and 28-2 are not connected to any other conductors, and therefore are in a floating state. The thin dummy conductor 26-2 has the same shape as the thin dummy conductor 26-1, and completely overlaps the thin dummy conductor 26-1 when viewed from above. The thin dummy conductor 28-2 has the same shape as the thin dummy conductor 28-1, and completely overlaps the thin dummy conductor 28-1 when viewed from above.

The thin dummy conductors 30-1, 32-1, 34-1 and 36-1 are disposed on the upper surface of the insulating sheet 16-2 where the thin dummy conductor 26-1 is disposed, and are arranged to surround the thin dummy conductor 26-1. Accordingly, when viewed from above, the thin dummy conductors 30-1, 32-1, 34-1 and 36-1 do not overlap the thin dummy conductor 26-1. Specifically, the thin dummy conductor 30-1 is located on the right side of the thin dummy conductor 26-1. The thin dummy conductor 32-1 is located on the back side of the thin dummy conductor 26-1. The thin dummy conductor 34-1 is located on the left side of the thin dummy conductor 26-1. The thin dummy conductor 36-1 is located on the front side of the thin dummy conductor 26-1. When viewed from above, the centers of the thin dummy conductors 30-1, 32-1, 34-1 and 36-1 are located within the area A14.

The thin dummy conductors 30-2, 32-2, 34-2 and 36-2 are disposed on the upper surface of the insulating sheet 16-3 where the thin dummy conductor 26-2 is disposed, and are arranged to surround the thin dummy conductor 26-2. Accordingly, when viewed from above, the thin dummy conductors 30-2, 32-2, 34-2 and 36-2 do not overlap the thin dummy conductors 26-1 and 26-2. Specifically, the thin dummy conductor 30-2 is located on the right side of the thin dummy conductor 26-2. The thin dummy conductor 32-2 is located on the back side of the thin dummy conductor 26-2. The thin dummy conductor 34-2 is located on the left side of the thin dummy conductor 26-2. The thin dummy conductor 36-2 is located on the front side of the thin dummy conductor 26-2. When viewed from above, the centers of the thin dummy conductors 30-2, 32-2, 34-2 and 36-2 are located within the area A14.

The thin dummy conductors 40-1, 42-1, 44-1 and 46-1 are disposed on the upper surface of the insulating sheet 16-2 where the thin dummy conductor 28-1 is disposed, and are arranged to surround the thin dummy conductor 28-1. Accordingly, when viewed from above, the thin dummy conductors 40-1, 42-1, 44-1 and 46-1 do not overlap the thin dummy conductor 28-1. Specifically, the thin dummy conductor 40-1 is located on the right side of the thin dummy conductor 28-1. The thin dummy conductor 42-1 is located on the back side of the thin dummy conductor 28-1. The thin dummy conductor 44-1 is located on the left side of the thin dummy conductor 28-1. The thin dummy conductor 46-1 is located on the front side of the thin dummy conductor 28-1. When viewed from above, the centers of the thin dummy conductors 40-1, 42-1, 44-1 and 46-1 are located within the area A11.

The thin dummy conductors 40-2, 42-2, 44-2 and 46-2 are disposed on the upper surface of the insulating sheet 16-3 where the thin dummy conductor 28-2 is disposed, and are arranged to surround the thin dummy conductor 28-2. Accordingly, when viewed from above, the thin dummy conductors 40-2, 42-2, 44-2 and 46-2 do not overlap the thin dummy conductors 28-1 and 28-2. Specifically, the thin dummy conductor 40-2 is located on the right side of the thin dummy conductor 28-2. The thin dummy conductor 42-2 is located on the back side of the thin dummy conductor 28-2. The thin dummy conductor 44-2 is located on the left side of the thin dummy conductor 28-2. The thin dummy conductor 46-2 is located on the front side of the thin dummy conductor 28-2. When viewed from above, the centers of the thin dummy conductors 40-2, 42-2, 44-2 and 46-2 are located within the area A11.

The multilayer substrate 12a and the component mounted board 10a configured as described above have the same effects as the multilayer substrate 12 and the component mounted board 10.

In the multilayer substrate 12a and the component mounted board 10a, the thin dummy conductors 30-1, 32-1, 34-1 and 36-1 are disposed around the dummy conductor 26-1. This prevents the thin dummy conductor 26-1 from being displaced in the front-back direction and in the right-left direction. For the same reason, the dummy conductors 26-2, 28-1 and 28-2 are prevented from being displaced in the front-back direction and in the right-left direction. Accordingly, the dummy conductors 26-1, 26-2, 28-1 and 28-2 function effectively, and it is possible to prevent the mounted component 14 from tilting on the multilayer substrate 12 more effectively.

Figure 13:
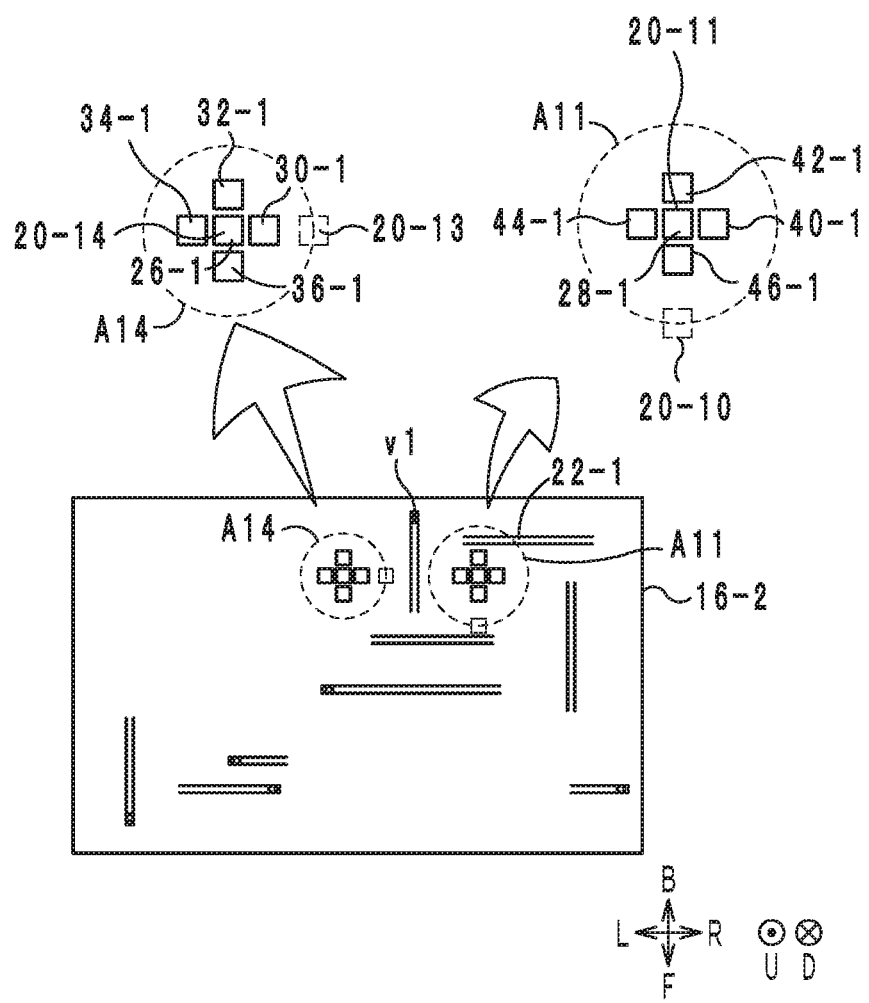
FIG. 13 is a top view of an insulating sheet 16-2 of a multilayer substrate 12b according to a second modification of a preferred embodiment of the present invention.

Next, a multilayer substrate and a component mounted board according to a second modification of a preferred embodiment of the present invention will be described with reference to the drawings. FIG. 13 is a top view of the insulating sheet 16-2 of the multilayer substrate 12b according to the second modification. FIG. 14 is a sectional view of the component mounted board 10b according to the second modification.

As shown in FIG. 13, the multilayer substrate 12b differs from the multilayer substrate 12a in the locations of the thin dummy conductors 26-1, 26-2, 28-1, 28-2, 30-1, 32-1, 34-1, 36-1, 30-2, 32-2, 34-2, 36-2, 40-1, 42-1, 44-1, 46-1, 40-2, 42-2, 44-2 and 46-2. More specifically, in the multilayer substrate 12b, the thin dummy conductors 26-1 and 26-2 overlap the external electrode 20-14 when viewed from above. The thin dummy conductors 28-1 and 28-2 overlap the external electrode 20-11 when viewed from above. The locations of the thin dummy conductors 30-1, 32-1, 34-1, 36-1, 30-2, 32-2, 34-2, 36-2, 40-1, 42-1, 44-1, 46-1, 40-2, 42-2, 44-2 and 46-2 relative to the thin dummy conductors 26-1, 26-2, 28-1 and 28-2 in the multilayer substrate 12b are the same as those in the multilayer substrate 12a, and descriptions thereof are omitted.

The multilayer substrate 12b and the component mounted board 10b configured as described above have the same effects as the multilayer substrate 12a and the component mounted board 10a.

The thin dummy conductors 26-1 and 26-2 are located just under the external electrode 20-14. Accordingly, the dummy conductors 26-1 and 26-2 effectively prevent the external electrode 20-14 from sinking by pressure applied thereto at the time of mounting of the component 14. For the same reason, the external electrode 20-11 is prevented from sinking. Hence, it is possible to prevent the mounted component 14 from tilting on the multilayer substrate 12 more effectively.

In the multilayer substrate 12b, also, the thin dummy conductor 26-1 is located just under the external electrode 20-14. Accordingly, at the time of mounting of the component 14, the thin dummy conductor 26-1 is pressed downward strongly by the external electrode 20-14. This may cause displacement of the thin dummy conductor 26-1 in the front-back direction and in the right-left direction.

In the multilayer substrate 12b and the component mounted board 10b, therefore, the thin dummy conductors 30-1, 32-1, 34-1 and 36-1 are located around the thin dummy conductor 26-1. Accordingly, at the time of compression bonding to form the multilayer substrate 12b and in other occasions, the dummy conductors 30-1, 32-1, 34-1 and 36-1 prevent the thin dummy conductor 26-1 from being displaced in the front-back direction and in the right-left direction. Thus, in the multilayer substrate 12b where the thin dummy conductor 26-1 is located just under the external electrode 20-14, it is preferred that the thin dummy conductors 30-1, 32-1, 34-1 and 36-1 are provided. For the same reason, the thin dummy conductors 26-2, 28-1 and 28-2 are prevented from being displaced in the front-back direction and in the right-left direction.

By adjusting the number of thin dummy conductors aligned in the up-down direction and adjusting the number of thin dummy conductors aligned in the front-back direction or the right-left direction, it is possible to adjust the amount of sinking of the external electrode.

Figure 15:
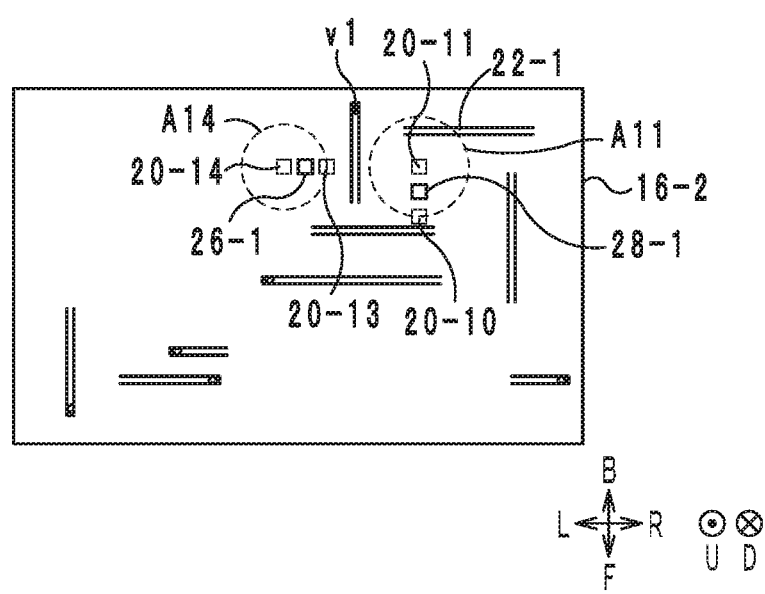
FIG. 15 is a top view of an insulating sheet 16-2 of a multilayer substrate 12c according to a third modification of a preferred embodiment of the present invention.

Next, a multilayer substrate and a component mounted board according to a third modification of a preferred embodiment of the present invention will be described with reference to the drawings. FIG. 15 is a top view of the insulating sheet 16-2 of the multilayer substrate 12c according to the third modification. FIG. 14 is a sectional view of the component mounted board 10c according to the third modification.

Figure 16:
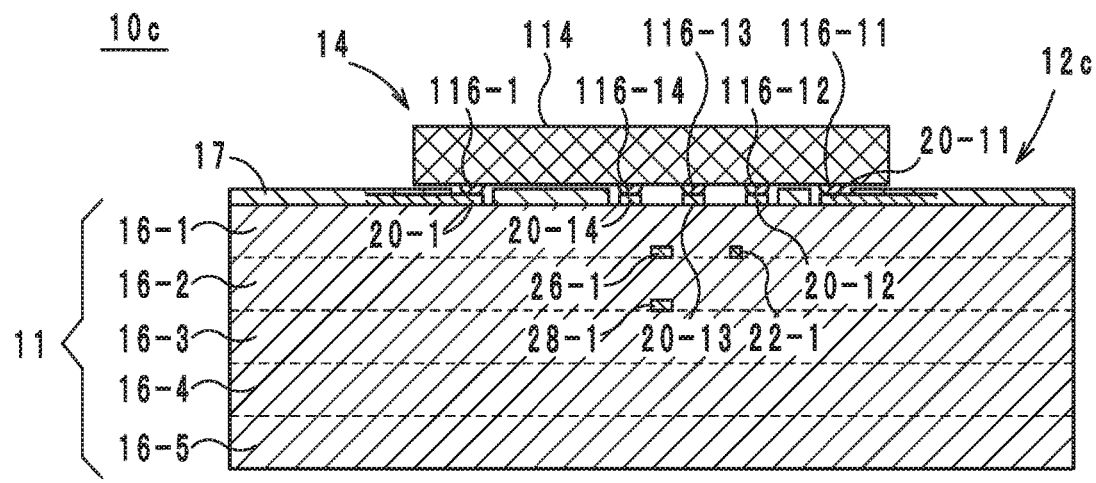
FIG. 16 is a sectional view of a component mounted board 10c according to the third modification of a preferred embodiment of the present invention.

As shown in FIGS. 15 and 16, the multilayer substrate 12c differs from the multilayer substrate 12a in that the multilayer substrate 12c does not include the thin dummy conductors 30-1, 30-2, 32-1, 32-2, 34-1, 34-2, 36-1, 36-2, 40-1, 42-1, 42-2, 44-1, 22-2, 46-1 and 46-2. Thus, the thin dummy conductors 30-1, 30-2, 32-1, 32-2, 34-1, 34-2, 36-1, 36-2, 40-1, 42-1, 42-2, 44-1, 22-2, 46-1 and 46-2 are not necessarily required.

Next, a multilayer substrate according a fourth modification of a preferred embodiment of the present invention will be described with reference to the drawings. FIG. 17 is a sectional view of a component mounted board 10d according to the fourth modification.

The multilayer substrate 12d according to the fourth modification differs from the multilayer substrate 12c in the location of the thin dummy conductor 26-2. In the multilayer substrate 12d, the thin dummy conductor 26-2 (an example of a second dummy conductor) does not overlap the thin dummy conductor 26-1 (an example of a first dummy conductor) when viewed from above, and the thin dummy conductor 26-2 is disposed on the insulating sheet 16-3 that is different from the insulating sheet 16-2 where the thin dummy conductor 26-1 is disposed. Thus, the thin dummy conductors 26-1 and 26-2 do not need to overlap each other when viewed from above.

Also, the thin dummy conductor 28-2 does not overlap the thin dummy conductor 28-1 when viewed from above, and the thin dummy conductor 28-2 is disposed on the insulating sheet 16-3 that is different from the insulating sheet 16-2 where the thin dummy conductor 28-1 is disposed, though it is not shown in FIG. 17. The thin dummy conductors 28-1 and 28-2 are located in front of the external electrode 20-11 when viewed from above, and therefore, the thin dummy conductors 28-1 and 28-2 are not shown in FIG. 17.

Next, a multilayer substrate according to a fifth modification of a preferred embodiment of the present invention will be described with reference to the drawings. FIG. 18 is a sectional view of a component mounted board 10e according to the fifth modification.

The multilayer substrate 12e according to the fifth modification differs from the multilayer substrate 12d in the location of the thin dummy conductor 26-2. In the multilayer substrate 12e, the thin dummy conductor 26-2 (an example of a second dummy conductor) does not overlap the thin dummy conductor 26-1 (an example of a first dummy conductor) when viewed from above, and the thin dummy conductor 26-2 is disposed on the insulating sheet 16-2 where the thin dummy conductor 26-1 is disposed. In this modification, the thin dummy conductor 26-2 is located on the right side of the thin dummy conductor 26-1.

Also, the thin dummy conductor 28-2 does not overlap the thin dummy conductor 28-1 when viewed from above, and the thin dummy conductor 28-2 is disposed on the insulating sheet 16-2 where the thin dummy conductor 28-1 is disposed, though it is not shown in FIG. 18. The thin dummy conductors 28-1 and 28-2 are located in front of the external electrode 20-11 when viewed from above, and therefore, the thin dummy conductors 28-1 and 28-2 are not shown in FIG. 18.

Next, a multilayer substrate according to a sixth modification of a preferred embodiment of the present invention will be described with reference to the drawings. FIG. 19 is a sectional view of a component mounted board 10f according to a sixth modification.

The multilayer substrate 12f according to the sixth modification differs from the multilayer substrate 12 in that the multilayer substrate 12f includes dummy via-hole conductors vd1 to vd3 (examples of a first dummy conductor and examples of a first dummy via-hole conductor) instead of the thin dummy conductor 26-1 and includes dummy via-hole conductors vd4 to vd6 (the dummy via-hole conductors vd5 and vd6 not shown in the drawings) instead of the thin dummy conductor 28-1.

The dummy via-hole conductors vd1 to vd3 are located within the area A14 when viewed above, and are aligned in this order from left to right. The dummy via-hole conductors vd4 to vd6 are located within the area A11 when viewed above, and are aligned in this order from back to front. Therefore, the dummy via-hole conductors vd5 and vd6 are not shown in FIG. 19. The dummy via-hole conductors vd1 to vd6 pierce through the insulating sheet 16-2 in the up-down direction. The dummy via-hole conductors vd1 to vd6 are not connected to any other conductors and accordingly are in a floating state. It is preferred that the dummy via-hole conductors vd1 to vd6 are made of the same material as the other via-hole conductors v1 to v4 (examples of a second via-hole conductor) so that the dummy via-hole conductors vd1 to vd6 can be formed in the same step as the step of forming the other via-hole conductors v1 to v4.

The multilayer substrate 12*f* and the component mounted board 10*f* configured as described above have the same effects as the multilayer substrate 12 and the component mounted board 10.

Next, a multilayer substrate according to a seventh modification of a preferred embodiment of the present invention will be described with reference to the drawings. FIG. 20 is a sectional view of a component mounted board 10*g* according to a seventh modification.

The multilayer substrate 12*g* according to the seventh modification differs from the multilayer substrate 12*f* in that the multilayer substrate 12*g* further includes thin dummy conductors 26-1, 26-2, 28-1 and 28-2. The thin dummy conductors 26-1 and 28-1 of the multilayer substrate 12*f* have the same shapes as the dummy conductors 26-1 and 28-1 of the multilayer substrate 12, respectively, and descriptions thereof are omitted. In the multilayer substrate 12*f*, the thin dummy conductors 26-2 and 28-2 have the same shapes as the thin dummy conductors 26-1 and 28-1, respectively, and completely overlap the thin dummy conductors 26-1 and 28-1, respectively, when viewed from above. The thin dummy conductors are disposed on the insulating sheet 16-3.

The dummy via-hole conductors vd1 to vd3 pierce through the insulating sheet 16-2 in the up-down direction, and connect the thin dummy conductor 26-1 (an example of a first dummy conductor) and the thin dummy conductor 26-2 (an example of a second dummy conductor). The dummy via-hole conductors vd1 to vd3 and the thin dummy conductors 26-1 and 26-2 are not connected to any other conductors, and accordingly are in a floating state.

The dummy via-hole conductors vd4 to vd6 pierce through the insulating sheet 16-2 in the up-down direction, and connect the thin dummy conductor 28-1 and the thin dummy conductor 28-2. The dummy via-hole conductors vd4 to vd6 and the thin dummy conductors 28-1 and 28-2 are not connected to any other conductors, and accordingly are in a floating state.

The multilayer substrate 12*g* and the component mounted board 10*g* configured as described above have the same effects as the multilayer substrate 12*f* and the component mounted board 10*f*.

In the multilayer substrate 12*g* and the component mounted board 10*g*, the thin dummy conductor 26-1 and the thin dummy conductor 26-2 are connected by the dummy via-hole conductors vd1 to vd3. This prevents the thin dummy conductors 26-1 and 26-2 from being displaced in the front-back direction and the right-left direction. Same applies to the thin dummy conductors 28-1 and 28-2.

In the multilayer substrate 12*g* and the component mounted board 10*g*, also, the thin dummy conductors 26-1, 26-2 and the dummy via-hole conductors vd1 to vd3 define a three-dimensional structure, and with this arrangement, sinking of the external electrodes 20-13 and 20-14 is prevented more effectively.

Other Preferred Embodiments

Multilayer substrates, component mounted boards and production methods of component mounted boards according to various preferred embodiments of the present invention are not limited to the multilayer substrates 12 and 12*a* to 12*g*, the component mounted boards 10 and 10*a* to 10*g* and the production methods of the component mounted boards 10 and 10*a* to 10*g*, and it is possible to modify these in various ways without departing from the scope of the present invention.

The elements of the multilayer substrates 12 and 12*a* to 12*g*, the elements of the component mounted boards 10 and 10*a* to 10*g* and the elements of the production methods of the component mounted boards 10 and 10*a* to 10*g* may be combined arbitrarily.

In the above-described preferred embodiments and modifications, the thin dummy conductors and/or the dummy via-hole conductors are preferably located in the areas A11 and A14 when viewed from above. However, thin dummy conductors and/or dummy via-hole conductors may be disposed in all of the areas A3 to A5 and A8 to A14. In other words, one or more thin dummy conductors and/or one or more dummy via-hole conductors need to be disposed in at least one of the areas A3 to A5 and A8 to A14 having radii of D3 to D5 and D8 to D14 that are smaller than the average Dave. In order to prevent sinking of the areas effectively, it is preferred that one or more thin dummy conductors and/or one or more dummy via-hole conductors are disposed preferentially in an area having a smaller radius.

It is preferred that no thin dummy conductors and no dummy via-hole conductors are disposed in the areas A1, A2, A6 and A7 having radii of D1, D2, D6 and D7 that are greater than the average Dave. However, one or more thin dummy conductors and/or one or more dummy via-hole conductors may be disposed in at least one of the areas A1, A2, A6 and A7 having radii of D1, D2, D6 and D7 that are greater than the average Dave. In this case, thin dummy conductors and dummy via-hole conductors are arranged such that the density per unit area of thin dummy conductors and dummy via-hole conductors disposed in the one or more of the areas A3 to A5 and A8 to A14 is higher than the density per unit area of thin dummy conductors and dummy via-hole conductors disposed in the one or more areas of the areas A1, A2, A6 and A7.

Instead of the thin dummy conductors 26-1, 26-2, 28-1, 28-2, 30-1, 30-2, 32-1, 32-2, 34-1, 34-2, 36-1, 36-2, 40-1, 40-2, 42-1, 42-2, 44-1, 44-2, 46-1 and 46-2, thin dummy elements made of any material other than metal, such as resin, may be used. It is preferred that the material of the thin dummy conductors 26-1, 26-2, 28-1, 28-2, 30-1, 30-2, 32-1, 32-2, 34-1, 34-2, 36-1, 36-2, 40-1, 40-2, 42-1, 42-2, 44-1, 44-2, 46-1 and 46-2 is the same as the material of the wiring conductors 22-1 to 22-3. It is also preferred that the material of the thin dummy conductors 26-1, 26-2, 28-1, 28-2, 30-1, 30-2, 32-1, 32-2, 34-1, 34-2, 36-1, 36-2, 40-1, 40-2, 42-1, 42-2, 44-1, 44-2, 46-1 and 46-2 is harder than the material of the insulating sheets 16-1 to 16-5. Here, the word "harder" means having a greater Young's modulus.

In the above-described preferred embodiments and modifications, the external electrodes 20-1 to 20-14 are arranged along the outer edge of the area A0. However, the external electrodes 20-1 to 20-14 may be located near the center of the area A0 rather than near the outer edge of the area A0.

As thus far described, preferred embodiments of the present invention are effectively applied to multilayer substrates, component mounted boards and methods for producing component mounted boards, and are useful in preventing a component mounted on a multilayer substrate from tilting on the multilayer substrate.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer substrate comprising:
an element assembly including a principal surface;
a first to n-th external electrode disposed on the principal surface and to be used to mount a component, where n is an integer not less than 3; and
at least one first dummy conductor disposed inside the element assembly and being in a floating state; wherein
when the element assembly is viewed from a normal direction that is normal to the principal surface, a distance between an m-th external electrode and a nearest external electrode therefrom among the first to n-th external electrodes is defined as a distance Dm, where m is an integer not less than 1 and not more than n;
an average of distances D1 to Dn is defined as an average Dave;
when the element assembly is viewed from the normal direction, an area within a circle with a center on the m-th external electrode and with a radius of Dm is defined as an area Am; and
the first dummy conductor is located in at least one area Am with the radius of Dm smaller than the average Dave when viewed from the normal direction.

2. The multilayer substrate according to claim 1, wherein the first dummy conductor is not located in at least one area Am with a radius of Dm greater than the average Dave when viewed from the normal direction.

3. The multilayer substrate according to claim 1, wherein the first dummy conductor is located in the area Am having a smallest radius of Dm when viewed from the normal direction.

4. The multilayer substrate according to claim 1, wherein the first dummy conductor overlaps the m-th external electrode corresponding to the area Am with the radius of Dm smaller than the average Dave when viewed from the normal direction.

5. The multilayer substrate according to claim 1, wherein:
the element assembly includes a plurality of insulating layers stacked in the normal direction;
the multilayer substrate further includes a second dummy conductor;
the first dummy conductor and the second dummy conductor are first thin conductors;
the second dummy conductor is located in the area Am with the radius of Dm smaller than the average Dave and does not overlap the first dummy conductor when viewed from the normal direction; and
the second dummy conductor is disposed on one of the insulating layers, while the first dummy conductor is disposed on another of the insulating layers.

6. The multilayer substrate according to claim 1, wherein:
the element assembly includes a plurality of insulating layers stacked in the normal direction;
the multilayer substrate further includes a second dummy conductor;
the first dummy conductor and the second dummy conductor are first thin conductors;
the second dummy conductor is located in the area Am with the radius of Dm smaller than the average Dave and overlaps the first dummy conductor when viewed from the normal direction; and
the second dummy conductor is disposed on one of the insulating layers, while the first dummy conductor is disposed on another of the insulating layers.

7. The multilayer substrate according to claim 6, further comprising a first dummy via-hole conductor piercing through at least one of the plurality of insulating layers to connect the first dummy conductor and the second dummy conductor.

8. The multilayer substrate according to claim 1, wherein:
the element assembly includes a plurality of insulating layers stacked in the normal direction;
the multilayer substrate further includes a second dummy conductor;
the first dummy conductor and the second dummy conductor are first thin conductors;
the second dummy conductor is located in the area Am with the radius of Dm smaller than the average Dave and does not overlap the first dummy conductor when viewed from the normal direction; and
the second dummy conductor and the first dummy conductor are disposed on one of the insulating layers.

9. The multilayer substrate according to claim 1, wherein the first dummy conductor is a first thin conductor.

10. The multilayer substrate according to claim 1, wherein the first dummy conductor is a first via-hole conductor.

11. The multilayer substrate according to claim 10, further comprising:
a second thin conductor disposed in the element assembly;
a second via-hole conductor connected to the second thin conductor; wherein
the first via-hole conductor and the second via-hole conductor are made of a same material.

12. The multilayer substrate according to claim 9, further comprising a second thin conductor disposed in the element assembly, wherein the first thin conductor and the second thin conductor are made of a same material.

13. A component mounted board comprising:
the multilayer substrate according to claim 1; and
a component including a first to n-th bump and mounted on the principal surface of the multilayer substrate, where n is an integer not less than 3; wherein
the first to n-th external electrodes are ultrasonically bonded to the first to n-th bumps, respectively.

14. The component mounted board according to claim 13, wherein the first dummy conductor is not located in at least one area Am with a radius of Dm greater than the average Dave when viewed from the normal direction.

15. The component mounted board according to claim 13, wherein the first dummy conductor is located in the area Am having a smallest radius of Dm when viewed from the normal direction.

16. The component mounted board according to claim 13, wherein the first dummy conductor overlaps the m-th external electrode corresponding to the area Am with the radius of Dm smaller than the average Dave when viewed from the normal direction.

17. The component mounted board according to claim 13, wherein:
the element assembly includes a plurality of insulating layers stacked in the normal direction;
the multilayer substrate further includes a second dummy conductor;
the first dummy conductor and the second dummy conductor are first thin conductors;
the second dummy conductor is located in the area Am with the radius of Dm smaller than the average Dave and does not overlap the first dummy conductor when viewed from the normal direction; and the first dummy conductor is disposed on one of the insulating layers, while the second dummy conductor is disposed on another of the insulating layers.

18. The component mounted board according to claim 13, wherein:

the element assembly includes a plurality of insulating layers stacked in the normal direction;

the multilayer substrate further includes a second dummy conductor;

the first dummy conductor and the second dummy conductor are first thin conductors;

the second dummy conductor is located in the area Am with the radius of Dm smaller than the average Dave and overlaps the first dummy conductor when viewed from the normal direction; and the first dummy conductor is disposed on one of the insulating layers, while the second dummy conductor is disposed on another of the insulating layers.

19. The component mounted board according to claim 18, further comprising a first dummy via-hole conductor piercing through at least one of the plurality of insulating layers to connect the first dummy conductor and the second dummy conductor.

* * * * *